United States Patent
Carson et al.

(10) Patent No.: US 7,547,572 B2
(45) Date of Patent: Jun. 16, 2009

(54) METHOD OF PROTECTING SEMICONDUCTOR CHIPS FROM MECHANICAL AND ESD DAMAGE DURING HANDLING

(75) Inventors: Richard Carson, Albuquerque, NM (US); Elaine Taylor, Albuquerque, NM (US); Douglas Collins, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 496 days.

(21) Appl. No.: 11/280,378

(22) Filed: Nov. 16, 2005

(65) Prior Publication Data

US 2007/0111378 A1 May 17, 2007

(51) Int. Cl.
*H01L 21/00* (2006.01)
(52) U.S. Cl. .............................. 438/68; 438/33; 438/113; 438/460; 257/42; 257/484; 257/594; 257/E29.015
(58) Field of Classification Search .................. 257/42, 257/484, 594, E29.015; 438/33, 113, 460, 438/462, 68, 48, 57
See application file for complete search history.

(56) References Cited

U.S. PATENT DOCUMENTS

| 6,157,066 | A  | * | 12/2000 | Kobayashi | 257/363 |
| 7,301,272 | B2 | * | 11/2007 | Chu et al. | 313/498 |
| 2002/0097059 | A1 | * | 7/2002 | Tartagni et al. | 324/687 |
| 2002/0195601 | A1 | * | 12/2002 | Kwasnick et al. | 257/40 |
| 2005/0191845 | A1 | * | 9/2005 | Takada | 438/622 |
| 2005/0258901 | A1 | * | 11/2005 | Khorramabadi | 330/254 |
| 2006/0175697 | A1 | * | 8/2006 | Kurosawa et al. | 257/686 |

* cited by examiner

*Primary Examiner*—Hsien-ming Lee
*Assistant Examiner*—Su C Kim

(57) ABSTRACT

A method and apparatus are provided for protecting a semiconductor device from damage. The method includes the steps of providing a active semiconductor device on a surface of the semiconductor substrate where the active device is surrounded by inactive semiconductor areas and providing a soft metallic guard ring only in the inactive semiconductor areas around the periphery of the active device wherein the metallic guard ring is connected to ground potential and not to the active device.

13 Claims, 4 Drawing Sheets

METHOD OF PROTECTING SEMICONDUCTOR CHIPS FROM MECHANICAL AND ESD DAMAGE DURING HANDLING

FIELD OF THE INVENTION

The field of the invention relates to semiconductors and more particularly to methods of semiconductor design and processing.

BACKGROUND OF THE INVENTION

Methods of manufacturing vertical cavity surface emitting laser (VCSEL) chips are generally known. However, one of the impediments to the successful manufacturing of such devices is the susceptibility of such devices to damage. In addition to physical damage, VCSELs and photodioes may be subject to electrostat discharge (ESD) or electrical over-stress (EOD) damage.

Two market trends are driving VCSEL and photodiode chip design towards a regime where die damage during handling is more and more likely. The first trend has to do with smaller active regions. Smaller active regions (volumes) are needed for higher speeds (e.g., 4 Gb/s, 10 Gb/s applications), modal control (e.g., sensing applications, optical mice, etc.) or both. ESD/EOS damage thresholds fall as one over the square of the optical aperture size of such devices.

In addition to smaller active regions, a second trend has to do with a smaller overall die (chip) size. Smaller chips are needed to reduce die manufacturing costs to meet market demanded prices.

To assemble separated die into packages, the die must be picked off of the wafer then placed into the final package. As chip size shrink, less chip area is allowed for the pickup tool. This means that die are being touched closer to their active regions where mechanical damage or ESD strikes are more likely to compromise chip reliability. The rate at which die fail early due to manufacturing damage is typically referred to as the infant mortality rate.

Statistics have shown that once installed, the average expected lifetime of conventional VCSELs are significantly longer than the devices in which the VCSELs are to be used. However, during manufacturing and before installation, VCSELs and photodiodes suffer a relatively high infant mortality rate due to handling practices. Mechanical damage and ESD strikes during chip handling, in fact, have been demonstrated to be the leading cause of infant mortality.

In addition to the direct loss due to infant mortality, additional efforts must be expended to identify damaged devices. For example, visual inspections are often performed to screen out die with mechanical damage.

However, visual inspection is imprecise, expensive and time consuming. Typically, the visual defects that must be screened out are either very small or very subtle.

Various electrical tests may be performed to identify die that have suffered ESD/EOS damage. In some cases, packaged die may be burned-in at currents and ambient temperatures above what would be expected during use in an attempt to identify damaged die.

Electrical tests for ESD damage are effective if properly performed and interpreted. However, they are also time consuming and expensive.

In addition, visual and/or electrical testing may not always be practical. For example, future applications, such as optical computer mice, are expected to be extremely price sensitive. Burn-in of all or some portion of packaged parts may not be economically feasible. Accordingly, a need exists for methods of reducing the root causes for infant mortality due to ESD and or reducing the need for visual inspections.

SUMMARY

A method and apparatus are provided for protecting a semiconductor device from damage. The method includes the steps of providing a active semiconductor device on a surface of the semiconductor substrate where the active device is surrounded by inactive semiconductor areas and providing a soft metallic guard ring only in the inactive semiconductor areas around the periphery of the active device wherein the metallic guard ring is connected to ground potential and not to the active device.

DETAILED DESCRIPTION OF AN ILLUSTRATED EMBODIMENT

Figure 1:
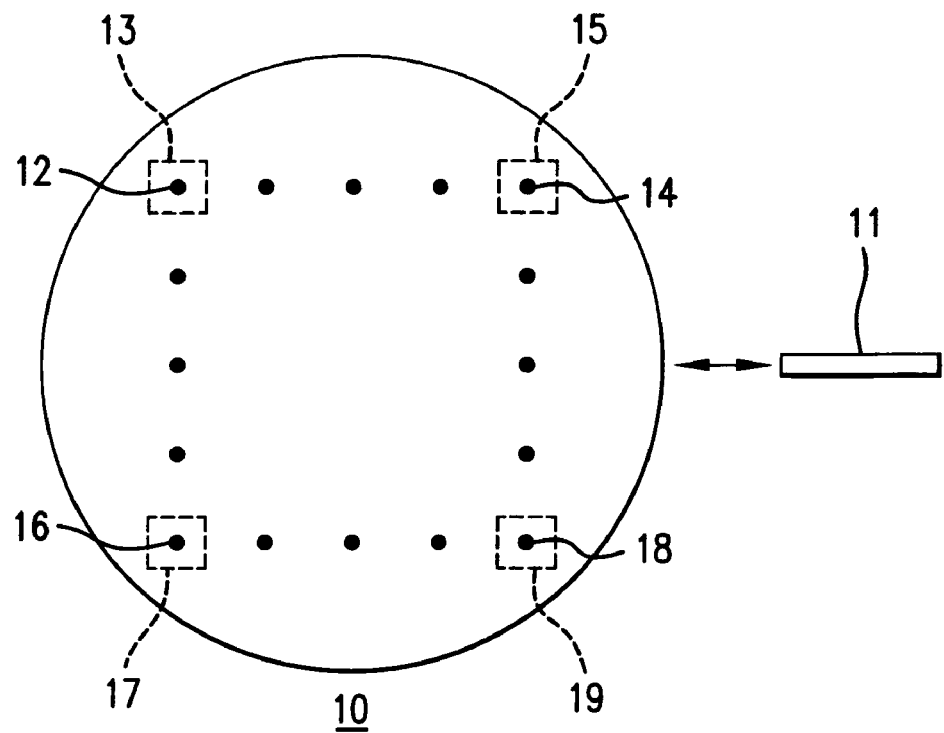
FIG. 1 is a top plan view of a wafer under an illustrated embodiment of the invention.
Figure 3:
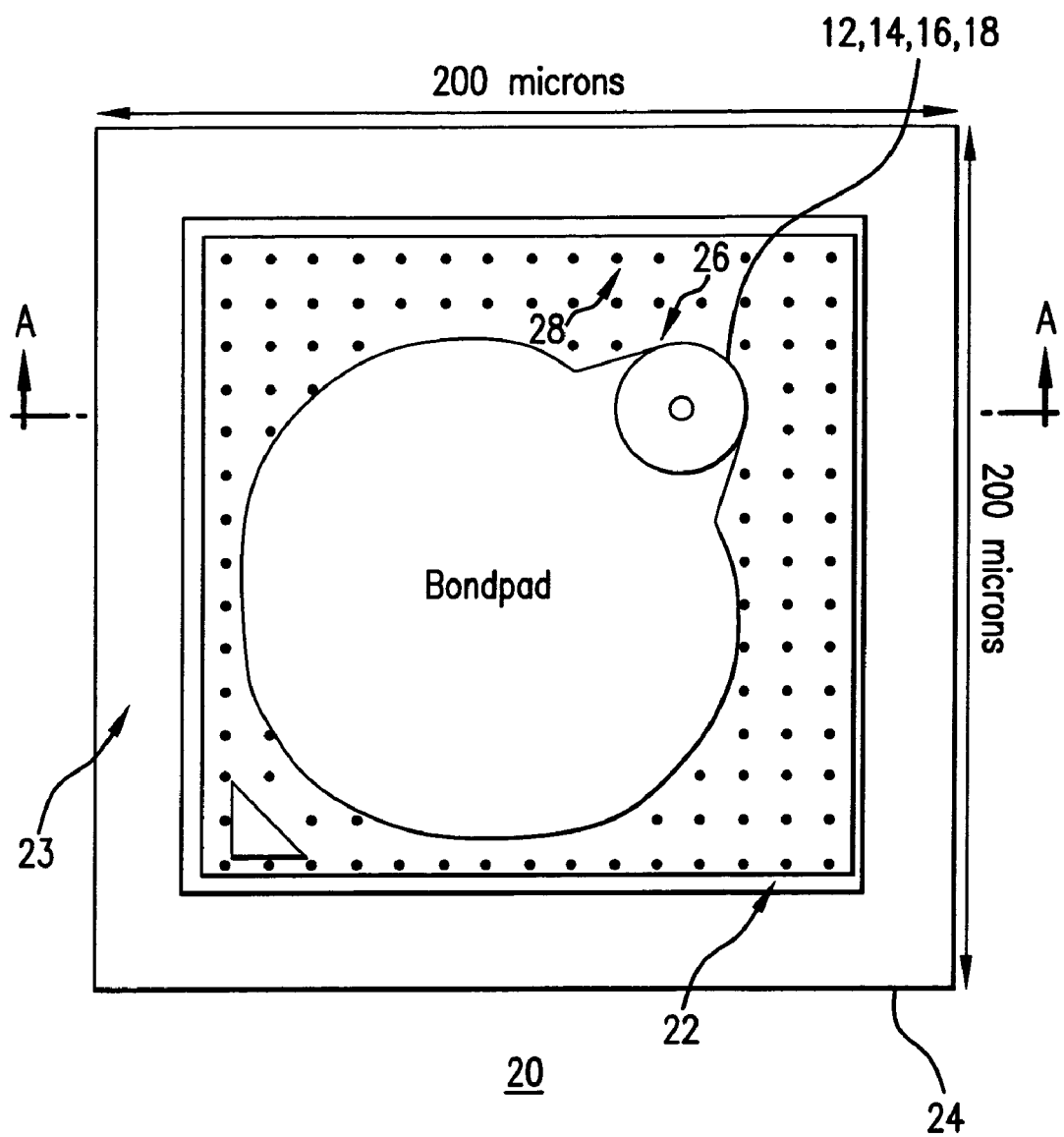
FIG. 3 is a top view of a chip of the wafer of FIG. 1.
Figure 4:
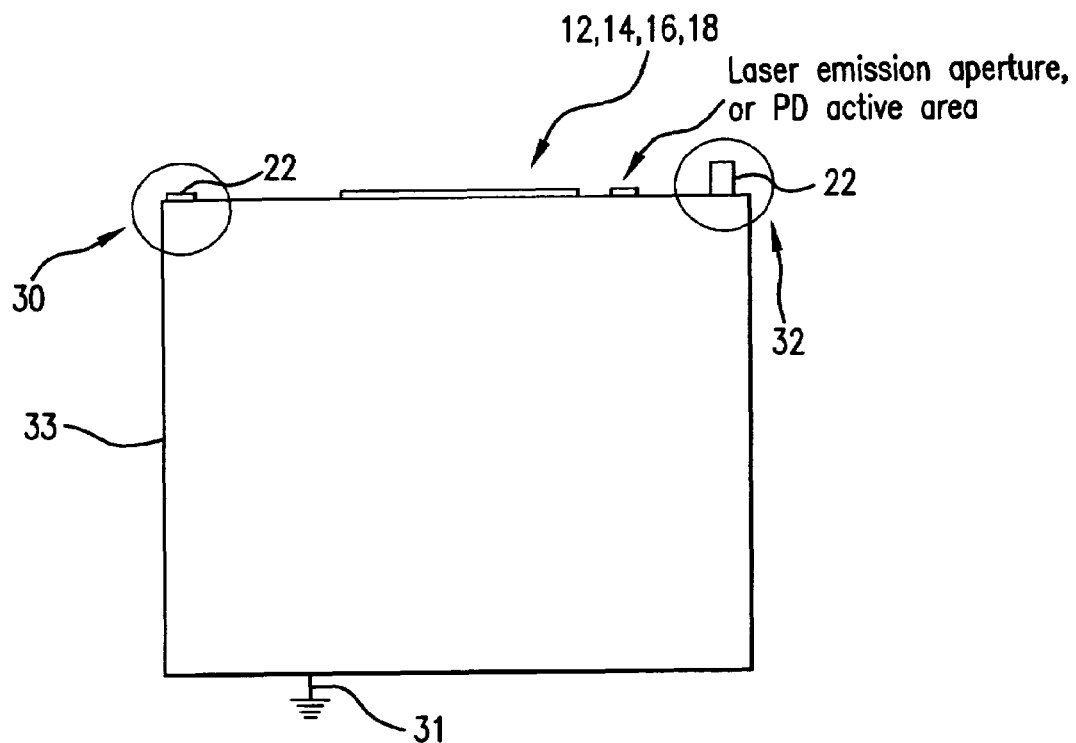
FIG. 4 is a side cut-away view of the chip of FIG. 3 under one embodiment of the invention.
Figure 5:
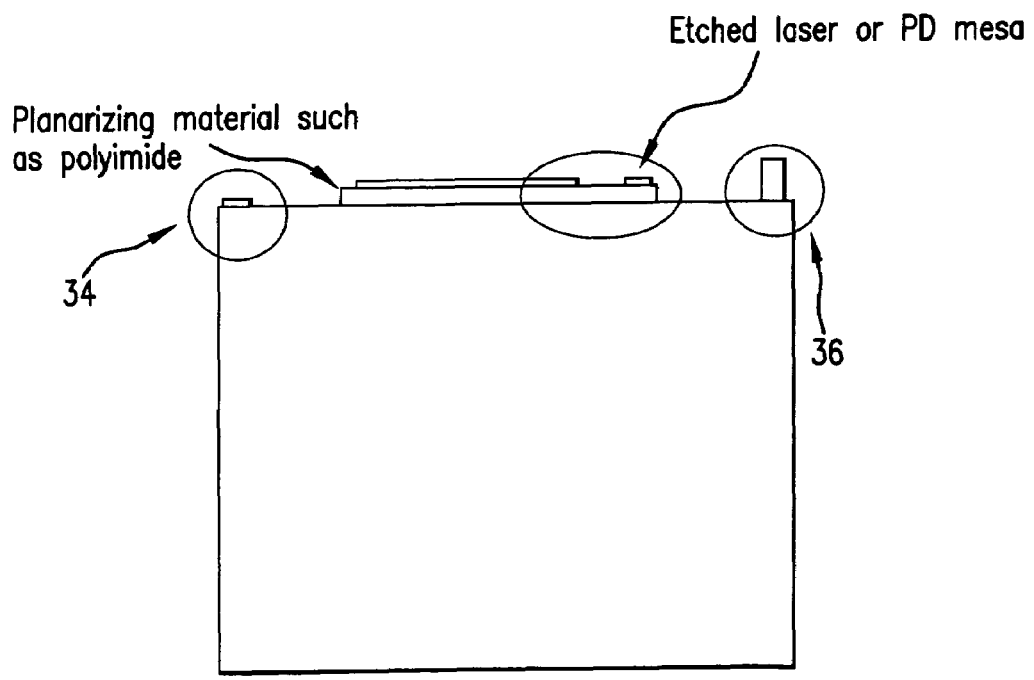
FIG. 5 is a side cut-away view of the chip of FIG. 3 under another embodiment of the invention.
Figure 6:
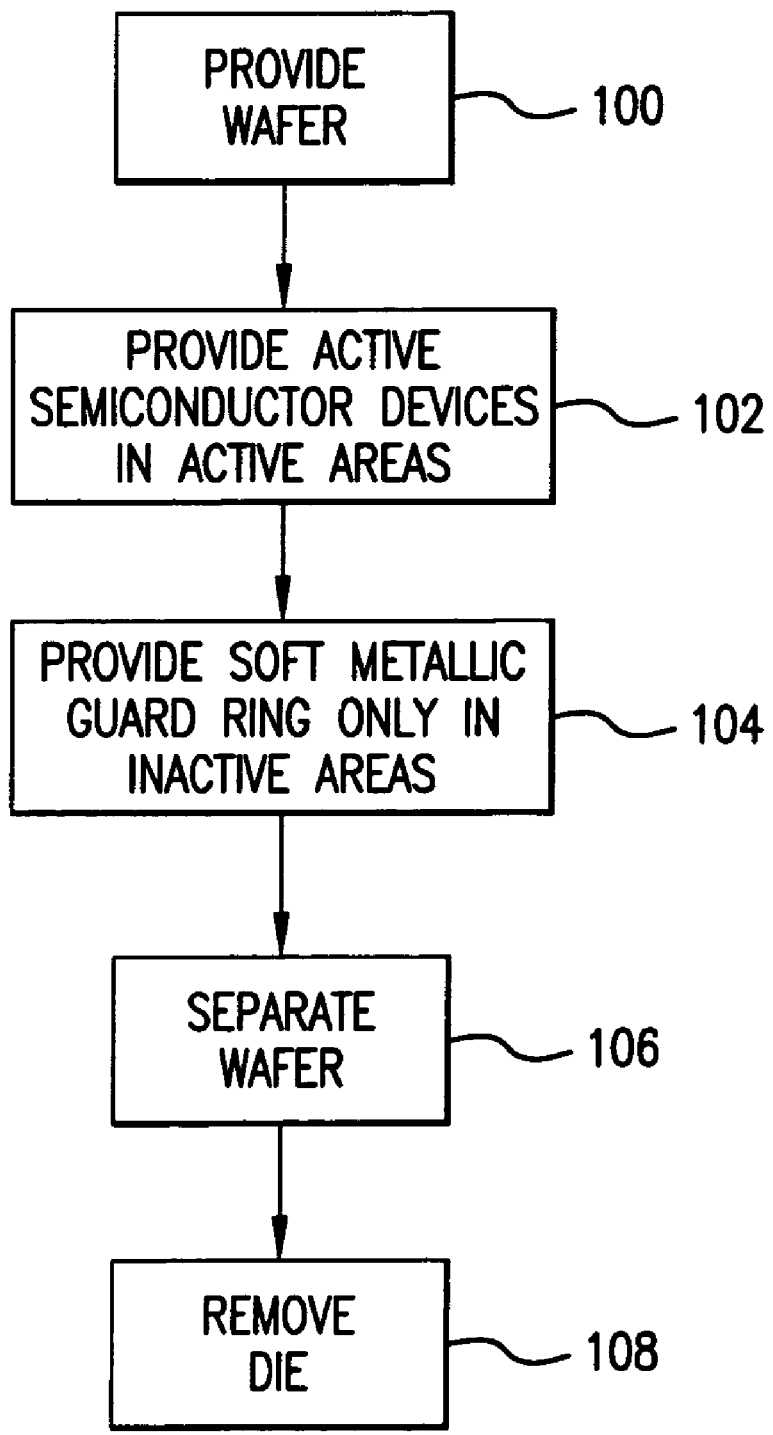
FIG. 6 is a flow chart of process steps that may be used to fabricate the wafer of FIG. 1.

FIG. 1 depicts a wafer 10 of semiconductor devices 12, 14, 16, 18 fabricated in accordance with an illustrated embodiment of the invention. FIG. 3 is an exemplary semiconductor chip 20 formed by separating the wafer 10 and where each chip 20 contains one of the semiconductor devices 12, 14, 16, 18. FIGS. 4 and 5 show alternative cut-away side views of the chip 20. The semiconductor devices 12, 14, 16, 18 may be VCSEL lasers or photodiodes and may be either arrays or single devices.

In addition to the semiconductor device 12, 14, 16, 18, each chip 20 is provided with a guard ring 22 (FIG. 3) for mechanically protecting the optical aperture of the semiconductor device 12, 14, 16, 18 from mechanical damage as well as to provide a harmless discharge path for any charge that may build up on pickup tools. If severe mechanical damage does occur, the guard ring is designed to provide a clear visual indicator of damage thereby increasing the likelihood that the chip 20 will be discarded before being used.

Turning now to the drawings, the wafer 10 may be divided into a grid of chip areas 13, 15, 17, 19 (where each chip area may be as depicted as shown in FIG. 3). The active areas 26 of the wafer 10 are separated from other active areas 26 (and surrounded) by inactive areas 28 (where the inactive areas 28 do not include any other active devices).

The chips 20 may be formed by providing 100 an appropriate wafer 10 and fabricating 102 the semiconductor devices 12, 14, 16, 18 in a conventional manner within the active areas 26. The guard rings 22 may be fabricated 104 within the chip areas 13, 15, 17, 19, but only within the inactive areas 28. The guard rings 22 may be created during fabrication of the semiconductor devices 12, 14, 16, 18 or as separate process steps.

FIG. 4 depicts a cross-section of the chip 20 along section lines A-A that shows a planar structure (i.e., an implanted VCSEL laser or photodiode). Under a first option (reference 30 in FIG. 4), the entire guard ring 22 may be formed by an evaporated metal process while also forming the interconnect and p-ohmic metal layers of the active device 12, 14, 16, 18. Under the first option, the guard ring is at least the same height as the tallest structure on the semiconductor device 12, 14, 16, 18 of the chip 20. Tallest, in this case, means the furthest distance measured away from the wafer surface. As shown in FIG. 4, the guard ring 22 forms a connection with a ground potential 31 through the substrate 33.

Under a second option (reference 32 of FIG. 4), an additional step may be added to the fabrication process flow to build up additional metal on the guard ring 22. In this case, the guard ring 22 may be defined using a photolithographic mask and metal may be plated onto the defined area either continuously around the semiconductor device as shown in FIG. 3 or discontinuously as shown by the different heights of the guard ring 22 depicted in reference areas 30 and 32 in FIG. 4. In this case, the guard ring 22 is significantly higher (taller) than any structure of the active device 12, 14, 16, 18.

FIG. 5 depicts a cross-section of the chip 20 along section lines A-A for a mesa structure (i.e., an oxide VCSEL laser or etched photodiode). Under a third option (reference 34 in FIG. 5), the entire guard ring 22 may be formed by an evaporated metal process while also forming the interconnect metal layers. In this case, the top of the guard ring 22 is lower than the top of the active region, so it provides very little mechanical protection. However, it can still provide an ESD discharge path to ground potential 31.

Under a fourth option (reference 36 of FIG. 5), an additional step may be added to the fabrication process flow to build up additional metal on the guard ring 22. In this case, the guard ring 22 may be defined using a photolithographic mask and metal may be plated onto the defined area. In this case, the guard ring 22 is again higher (taller) than any structure of the active device 12, 14, 16, 18.

The guard ring 22 may be fabricated of any appropriate, relatively soft metal. In one embodiment, the relatively soft metal may be gold.

Figure 2:
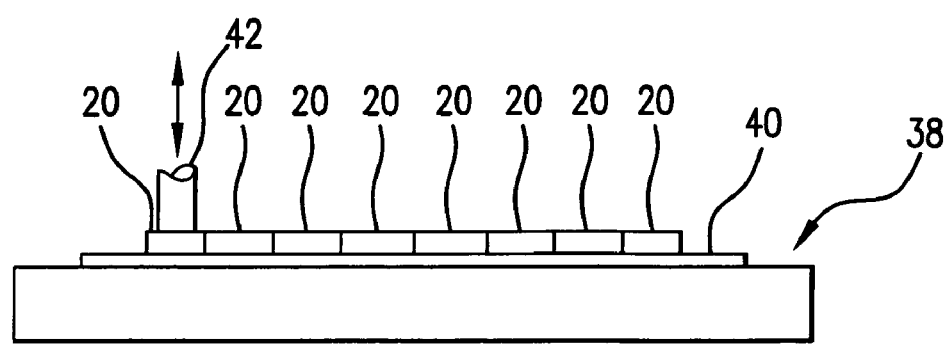
FIG. 2 is a side cut-away view of the wafer of FIG. 1.

Once fabricated, the wafer 10 may mounted to a saw frame 38 (FIG. 2) for separation 106. An adhesive layer 40 may be used to attach the wafer 10 to the dicing saw frame.

Once attached to the saw frame 38, the wafer 10 may be separated (while still attached to the saw frame 38) into the respective chips 20. Separation may be by dicing (using a dicing saw 11) or by cleaving.

Once separated, the chips 20 may be removed 108 from the saw frame 38 using a pick and place tool 42. Reference number 23 in FIG. 3 depicts an intended target area for the pick and place tool 42.

The use of the pick and place tool 42 (while necessary to remove the chips from the saw frame 38 can damage the chips 20 in any of a number of different ways. For example, static electricity may build up on the tool 42 and discharge through the device 12, 14, 16, 18. Alternatively, the tool 42 may strike the chip 20 at too high a rate of speed, thereby damaging the structure of the device 12, 14, 16, 18.

Under some illustrated embodiments of the invention (discussed above), the guard ring 22 on each chip 20 maybe the highest point on the die 20 so that if the surface of the die is struck during handling, the guard ring 20 would absorb the force protecting the active region of the laser or photodiode. Additionally, the ring 22 is fabricated from a soft metal, so that there would be a clear visual indication of mechanical damage. Additionally, the guard ring 22 is in electrical contact with a harmless ESD discharge path to ground potential so that any charge that builds up on the pickup tool would be safely bled conducted away from the chip 20 without damaging the active region of the chip 20.

A specific embodiment of novel apparatus for protecting semiconductor devices on a fabricated semiconductor wafer according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention, any and all modifications, variations, or equivalents that fall within the true spirit and scope of the basic underlying principles disclosed and claimed herein.

The invention claimed is:

1. A method of protecting a semiconductor device from damage comprising:
   providing an active semiconductor device on a surface of the semiconductor substrate where the active semiconductor device is directly surrounded by inactive semiconductor areas; and
   providing a soft metallic guard ring only in the inactive semiconductor areas around the periphery of the active semiconductor device wherein the soft metallic guard ring is connected to ground potential and not to the active semiconductor device, the soft metallic guard ring being softer than the semiconductor substrate;
   wherein the active semiconductor device on the surface of the semiconductor substrate further comprises a semiconductor wafer with a plurality of active semiconductor devices wherein each active semiconductor device is separated from other active semiconductor devices of the plurality of active semiconductor devices by inactive areas not containing an active semiconductor device and each active semiconductor device of the plurality of active semiconductor devices is surrounded by a soft metallic guard ring;
   further comprising separating the wafer into a plurality of die wherein each die of the plurality of die contains a single active semiconductor device with the soft metallic guard ring;
   further comprising removing a die from the wafer using a pick and place tool such that any mechanical damage to a die caused by the pick and place tool appears as a mark in the soft metallic guard ring and static electricity from the pick and place tool is dissipated to ground potential through the soft metallic guard ring.

2. The method of protecting the semiconductor device as in claim 1 wherein the soft metallic guard ring is continuous around the active semiconductor device.

3. The method of protecting the semiconductor device as in claim 1 wherein the soft metallic guard ring is discontinuous around the active semiconductor device.

4. The method of protecting the semiconductor device as in claim 1 wherein the semiconductor device further comprises a VCSEL laser.

5. The method of protecting the semiconductor device as in claim 1 wherein the semiconductor device further comprises a photodiode.

6. The method of protecting the semiconductor device as in claim 1 wherein the soft metallic guard ring further comprises gold.

7. The method of protecting the semiconductor device as in claim 1 wherein the step of providing the soft metallic guard ring further comprises photolithographically defining an area of the soft metallic guard ring and depositing a soft metal into the defined area.

8. Apparatus for protecting a semiconductor device from damage comprising:
- a semiconductor body having a surface including an active semiconductor device directly surrounded by inactive semiconductor areas;
- a grounding element disposed on said semiconductor body and peripherally surrounding said active semiconductor device only in the inactive semiconductor areas directly surrounding the active semiconductor device for preventing accidental ESD damage to said device by discharging any external object coming into proximate disposition to said body;
- wherein the semiconductor body having the surface including the active semiconductor device further comprises a semiconductor wafer with a plurality of active semiconductor devices wherein each active semiconductor device of the plurality of active semiconductor devices is separated from other active semiconductor devices of the plurality of active semiconductor devices on the wafer by inactive areas not containing an active semiconductor device and each active semiconductor device of the plurality of active semiconductor devices is surrounded by the grounding element;
- further comprising separating the wafer into a plurality of die wherein each die of the plurality of die contains an active semiconductor device with the grounding element;
- further comprising removing a die from the wafer using a pick and place tool such that any mechanical damage to a die caused by the pick and place tool also appears as a mark in the grounding element and static electricity from the pick and place tool is dissipated to ground potential through the grounding element.

9. The apparatus for protecting the semiconductor device as in claim 8 wherein the grounding element is continuous around the active semiconductor device.

10. The apparatus for protecting the semiconductor device as in claim 8 wherein the grounding element is discontinuous around the active semiconductor device.

11. The apparatus for protecting the semiconductor device as in claim 8 wherein the semiconductor device further comprises a VCSEL laser.

12. The apparatus for protecting the semiconductor device as in claim 8 wherein the semiconductor device further comprises a photodiode.

13. The apparatus for protecting the semiconductor device as in claim 8 wherein the grounding element further comprises gold.

* * * * *